(12) United States Patent
Chuang et al.

(10) Patent No.: US 8,163,374 B2
(45) Date of Patent: Apr. 24, 2012

(54) FORMATION OF CLOSE-PACKED SPHERE ARRAYS IN V-SHAPED GROOVES

(75) Inventors: Peng-Wei Chuang, Cambridge, MA (US); Caroline A. Ross, Arlington, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 138 days.

(21) Appl. No.: 12/795,318

(22) Filed: Jun. 7, 2010

(65) Prior Publication Data

US 2010/0239819 A1 Sep. 23, 2010

Related U.S. Application Data

(62) Division of application No. 11/854,872, filed on Sep. 13, 2007, now Pat. No. 7,790,045.

(60) Provisional application No. 60/825,501, filed on Sep. 13, 2006.

(51) Int. Cl.
*B32B 3/28* (2006.01)
*B32B 3/30* (2006.01)
(52) U.S. Cl. ......... 428/167; 977/888; 977/895; 977/900
(58) Field of Classification Search .................. 428/167; 216/2, 39, 41, 55, 83, 67, 99; 427/256, 309, 427/372.2; 977/888, 895, 900
See application file for complete search history.

(56) References Cited

U.S. PATENT DOCUMENTS

| | | | |
|---|---|---|---|
| 7,347,953 B2 | 3/2008 | Black et al. | |
| 7,361,991 B2 | 4/2008 | Saenger et al. | |
| 7,384,852 B2 | 6/2008 | Yang et al. | |
| 2007/0224823 A1 | 9/2007 | Sandhu | |
| 2008/0193658 A1 | 8/2008 | Millward | |
| 2008/0217292 A1 | 9/2008 | Millward et al. | |
| 2008/0233323 A1 | 9/2008 | Cheng et al. | |

OTHER PUBLICATIONS

Angelescu, Dan E. et al., "Shear-Induced Alignment in Thin Films of Spherical Nanodomains," Advanced Materials, 2005, pp. 1878-1881, No. 17, Wiley-VCH Verlag GmbH & Co., KGaA, Weinheim.

Black, C. T. et al., "Integration of Self-Assembled Diblock Copolymers for Semiconductor Capacitor Fabrication," Applied Physics Letters, Jul. 16, 2001, pp. 409-411, vol. 79, No. 3, American Institute of Physics.

Black, Charles T. et al., "Nanometer-Scale Pattern Registration and Alignment by Directed Diblock Copolymer Self-Assembly," IEEE Transactions on Nanotechnology, Sep. 2004, pp. 412-415, vol. 3, No. 3, IEEE.

Black, C. T., "Self-Aligned Self Assembly of Multi-Nanowire Silicon Field Effect Transistors," Applied Physics Letters, published online Oct. 13, 2005, pp. 163116-1 to 163116-3, vol. 87, American Institute of Physics.

(Continued)

*Primary Examiner* — Catherine A Simone
(74) *Attorney, Agent, or Firm* — Withrow & Terranova, P.L.L.C.

(57) ABSTRACT

The present invention relates to the self-assembly of a spherical-morphology block copolymer into V-shaped grooves of a substrate. Although spherical morphology block copolymers typically form a body-centered cubic system (bcc) sphere array in bulk, the V-shaped grooves promote the formation of a face-centered cubic system (fcc) sphere array that is well ordered. In one embodiment, the (111) planes of the fcc sphere array are parallel to the angled side walls of the V-shaped groove. The (100) plane of the fcc sphere array is parallel to the top surface of the substrate, and may show a square symmetry among adjacent spheres. This square symmetry is unlike the hexagonal symmetry seen in monolayers of spherical domains and is a useful geometry for lithography applications, especially those used in semiconductor applications.

21 Claims, 7 Drawing Sheets

OTHER PUBLICATIONS

Boker, A. et al., "Microscopic Mechanisms of Electric-Field-Induced Alignment of Block Copolymer Microdomains," Physical Review Letters, Sep. 23, 2002, pp. 135502-1 to 135502-4, vol. 89, No. 13, The American Physical Society.

Cheng, J. Y. et al., "Fabrication of Nanostructures with Long-Range Order Using Block Copolymer Lithography," Applied Physics Letters, Nov. 4, 2002, pp. 3657-3659, vol. 81, No. 19, American Institute of Physics.

Cheng, Joy Y. et al., "Formation of a Cobalt Magnetic Dot Array via Block Copolymer Lithography," Advanced Materials, Aug. 3, 2001, pp. 1174-1178, vol. 13.

Cheng, Joy Y. et al., "Nanostructure Engineering by Templated Self-Assembly of Block Copolymers," Nature Materials, Nov. 2004, pp. 823-828, vol. 3, Nature Publishing Group.

Cheng, Joy Y. et al., "Templated Self-Assembly of Block Copolymers: Effect of Substrate Topography," Advanced Materials, Oct. 2, 2003, pp. 1599-1602, vol. 15, No. 19, Wiley-VCH Verlag GmbH & Co., KGaA, Weinheim.

Edwards, Erik W. et al., "Mechanism and Kinetics of Ordering in Diblock Copolymer Thin Films on Chemically Nanopatterned Substrates," Journal of Polymer Science: Part B: Polymer Physics, 2005, pp. 3444-3459, vol. 43, Wiley Periodicals, Inc.

Fasolka, M. J. et al., "Observed Substrate Topography-Mediated Lateral Patterning of Diblock Copolymer Films," Physical Review Letters, Oct. 20, 1997, pp. 3018-3021, vol. 79, No. 16, The American Physical Society.

Guarini, K. W. et al., "Low Voltage, Scalable Nanocrystal FLASH Memory Fabricated by Templated Self Assembly," IEEE Electronic Device Letters, 2003, pp. 541-544, IEEE.

Hashimoto, Takeji et al., "The Effect of Temperature Gradient on the Microdomain Orientation of Diblock Copolymers Undergoing an Order-Disorder Transition," Macromolecules, published online Jan. 20, 1999, pp. 952-954, vol. 32, American Chemical Society.

Henkee, Chris S. et al., "The Effect of Surface Constraints on the Ordering of Block Copolymer Domains," Journal of Materials Science, 1988, pp. 1685-1694, vol. 23.

Li, R. R. et al., "Dense Arrays of Ordered GaAs Nanostructures by Selective Area Growth on Substrates Patterned by Block Copolymer Lithography," Applied Physics Letters, Mar. 27, 2000, pp. 1689-1691, vol. 76, No. 13, American Institute of Physics.

Lopes, Ward A. et al., "Hierarchical Self-Assembly of Metal Nanostructures on Diblock Copolymer Scaffolds," Nature, Dec. 13, 2001, pp. 735-738, vol. 414, Macmillan Magazines Ltd.

Matsen, M. W. et al., "Unifying Weak- and Strong-Segregation Block Copolymer Theories," Macromolecules, Feb. 12, 1996, pp. 1091-1098, vol. 29, No. 4, American Chemical Society.

Matsuo, Shigeki et al., "Formation of Free-Standing Micropyramidal Colloidal Crystals Grown on Silicon Substrate," Applied Physics Letters, Jun. 16, 2003, pp. 4283-4285, vol. 82, No. 24, American Institute of Physics.

Morkved, T. L. et al., "Local Control of Microdomain Orientation in Diblock Copolymer Thin Films with Electric Fields," Science, Aug. 16, 1996, pp. 931-933, vol. 273.

Naito, Katsuyuki et al., "2.5-Inch Disk Patterned Media Prepared by an Artificially Assisted Self-Assembling Method," IEEE Transactions on Magnetics, Sep. 2002, pp. 1949-1951, vol. 38, No. 5, IEEE.

Ni, Yizeng et al., "Transition Metal-Based Polymers with Controlled Architectures: Well-Defined Poly (ferrocenylsilane) Homopolymers and Multiblock Copolymers via the Living Anionic Ring-Opening Polymerization of Silicon-Bridged [1]Ferrocenophanes," Journal of the American Chemical Society, 1996, pp. 4102-4114, vol. 118, American Chemical Society.

Ozin, Geoffrey A. et al., "The Race for the Photonic Chip: Colloidal Crystal Assembly in Silicon Wafers," Advanced Functional Materials, Apr. 2001, pp. 95-104, vol. 11, No. 2, Wiley-VCH Verlag GmbH, D-69469 Weinheim.

Park, Miri et al., "Block Copolymer Lithography: Periodic Arrays of ~10 11 Holes in 1 Square Centimeter," Science, May 30, 1997, pp. 1401-1404, vol. 276, American Association for the Advancement of Science.

Ross, C. A. et al., "Magnetic Behavior of Lithographically Patterned Particle Arrays," Journal of Applied Physics, May 15, 2002, pp. 6848-6853, vol. 91, No. 10, American Institute of Physics.

Savas, T. A. et al., "Properties of Large-Area Nanomagnet Arrays with 10 nm Period Made by Interferometric Lithography," Journal of Applied Physics, Apr. 15, 1999, pp. 6160-6162, vol. 85, No. 8, American Institute of Physics.

Segalman, Rachel A. et al., "Graphoepitaxy of Spherical Domain Block Copolymer Films," Advanced Materials, Aug. 3, 2001, pp. 1152-1155, vol. 13.

Shin, Kyusoon et al., "Curving and Frustrating Flatland," Science, Oct. 1, 2004, p. 76, vol. 306, American Association for the Advancement of Science.

Stoykovich, Mark P. et al., "Directed Assembly of Block Copolymer Blends into Nonregular Device-Oriented Structures," Science, Jun. 3, 2005, pp. 1442-1446, vol. 308, American Association for the Advancement of Science.

Sundrani, Deepak et al., "Hierarchical Assembly and Compliance of Aligned Nanoscale Polymer Cylinders in Confinement," Langmuir, published online Mar. 11, 204, pp. 5091-5099, vol. 20, American Chemical Society.

Thomas, E. L. et al., "A Menagerie of Interface Structures in Copolymer Systems," Colloque de Physique, Dec. 1, 1990, pp. 363-374, Colloque C7, vol. 51, Supplement to No. 23, EDP Sciences.

Thomas, Edwin L. et al., "Ordered Packing Arrangements of Spherical Micelles of Diblock Copolymers in Two and Three Dimensions," Macromolecules, 1987, pp. 2934-2939, vol. 20, American Chemical Society.

Thurn-Albrecht, T. et al., "Ultrahigh-Density Nanowire Arrays Grown in Self-Assembled Diblock Copolymer Templates," Science, Dec. 15, 2000, pp. 2126-2129, vol. 290, American Association for the Advancement of Science.

Wu, Yiying et al., "Templated Synthesis of Highly Ordered Mesostructured Nanowires and Nanowire Arrays," Nano Letters, published online Oct. 14, 2004, pp. 2337-2342, vol. 4, No. 12, American Chemical Society.

Xiao, Shuaigang et al., "Graphoepitaxy of Cylinder-Forming Block Copolymers for User as Templates to Pattern Magnetic Metal Dot Arrays," Nanotechnology, online publication date Apr. 15, 2005, pp. S324-S329, vol. 16, IOP Publishing Ltd, United Kingdom.

Yin, Yadong et al., "Growth of Large Colloidal Crytstals with Their (100) Planes Oriented Parallel to the Surfaces of Supporting Substrates," Advance Materials, Apr. 18, 2002, pp. 605-608, vol. 14, No. 8, Wiley-VCH Verlag GmbH, D-69469, Weinheim.

Yin, Yadong et al., "Template-Assisted Self-Assembly: A Practical Route to Complex Aggregates of Monodispersed Colloids with Well-Defined Sizes, Shapes, and Structures," Journal of the American Chemical Society, published online Aug. 15, 2001, pp. 8718-8729, American Chemical Society.

Yokoyama, Hideaki et al., "Structure and Diffusion of Asymmetric Diblock Copolymers in Thin Films: A Dynamic Secondary Ion Mass Spectrometry Study," Marcomolecules, published online Nov. 20, 1998, pp. 8826-8830, vol. 31, American Chemical Society.

Yokoyama, Hideaki et al., "Structure of Asymmetric Diblock Copolymers in Thin Films," Macromolecules, published online Feb. 12, 2000, pp. 1888-1898, vol. 33, American Chemical Society.

Yu, Bin et al., "Confinement-Induced Novel Morphologies of Block Copolymers," Physical Review Letters, Apr. 7, 2006, pp. 138306-1 to 138306-4, vol. 96, No. 138306, The American Physical Society.

Van Der Meer, Paul R. et al.,"A temperature-controlled smart surface-acoustic-wave gas sensor," Sensors and Actuators A, 1998, 27-34, 71, Elsevier.

Bellare, J.R., et al., "Apparatus for 'On-the-Fly' Sample Preparation of Aerosol-Grown Block Copolymer Microdroplets," Proceedings of the 47th Annual Meeting of the Electron Microscopy Society of America, 1989, San Francisco Press, Inc., 354-355.

Chuang, V.P., et al., "Three-Dimensional Self-Assembly of Spherical Block Copolymer Domains into V-Shaped Grooves," Nano Letters, 6(10), pp. 2332-2337, published on web Sep. 23, 2006.

Non-Final Office Action Election/Restriction Requirement mailed Nov. 12, 2009, issued by the Patent Office during the prosecution of U.S. Appl. No. 11/854,872. 7 pages.

Notice of Allowance mailed Mar. 8, 2010, issued by the Patent Office during the prosecution of U.S. Appl. No. 11/854,872. 13 pages.

Notice of Allowance mailed Jul. 9, 2010, issued by the Patent Office during the prosecution of U.S. Appl. No. 11/854,872. 8 pages.

N = 1   |—200 nm—|

N = 2

N = 3

N = 4

N = 5

200 nm 200 nm 200 nm

US 8,163,374 B2

FORMATION OF CLOSE-PACKED SPHERE ARRAYS IN V-SHAPED GROOVES

RELATED APPLICATION DATA

This application is a divisional patent application of U.S. Application Ser. No. 11/854,872, now U.S. Pat. No. 7,790,045, filed Sep. 13, 2007, entitled FORMATION OF CLOSE-PACKED SPHERE ARRAYS IN V-SHAPED GROOVES, which claims priority to U.S. Provisional Patent Application No. 60/825,501, filed Sep. 13, 2006, both of which are incorporated herein by reference in their entireties.

FIELD OF THE INVENTION

The present invention relates to generating ordered patterns having square symmetry from a self-assembled block copolymer.

BACKGROUND OF THE INVENTION

Within the following document, reference is made to numerous documents that provide further information related to subject matter being discussed. These references are listed at the end of the Detailed Description of the Preferred Embodiments and are identified by numbers in brackets [X], where X is the numerical identifier of a pertinent document. These documents are incorporated by reference in their entireties.

Self-assembled block copolymer thin films have attracted a great deal of attention recently as templates for nanolithography [1-9]. A diblock copolymer contains two immiscible polymer chains covalently bonded together and, on annealing, undergoes a microphase separation to form self-assembled periodic nanoscale domains. The domains can exist in various morphologies depending on the volume fractions of the two constituents of the polymer, including spheres, cylinders, and lamellae. The domain size and period scale with the molecular weight, making these materials useful masks for nanofabrication. Thin films of block copolymers have been used to pattern semiconductor dot and antidot arrays [1,2], metal dots and nanowires [3-6], magnetic storage media [7], and devices, such as capacitors, memory cells, and transistors have been fabricated using block copolymer lithography [8-9].

Successful implementation of block copolymer (BCP) patterning depends on the ability to control the morphology, orientation, and packing of the domains. Block copolymer domain patterns typically have good short-range order but lack long-range order. Long-range ordering has been accomplished by various approaches such as the application of external electrical fields [10, 11], temperature gradients [12], shear fields [13], or by using chemically or topographically patterned substrates [14-21].

Most studies using patterned substrates have focused on the behavior of a monolayer of spherical or in-plane cylindrical block copolymer domains, or on short cylinders or lamellae oriented perpendicular to the surface. In addition, block copolymers have been confined within certain geometries such as pores or droplets [22-25], which introduce additional boundary conditions and can promote block copolymer morphologies not found in the bulk, such as the formation of concentric cylinders by lamellar block copolymers, or helical structures by cylindrical block copolymers.

As such, there has been difficulty obtaining block copolymer domain patterns that have good long-range ordering without requiring complex control or boundary conditions. There has been further difficulty obtaining additional geometries, such as square geometries, for block copolymer patterning. Accordingly, there is a need for a technique to obtain block copolymer domain patterns that have good long-range ordering and provide for enhanced geometries for such patterns.

SUMMARY OF THE INVENTION

The present invention relates to the self-assembly of a spherical-morphology block copolymer into V-shaped grooves of a substrate. Although spherical morphology block copolymers typically form a body-centered cubic system (bcc) sphere array in bulk, the V-shaped grooves promote the formation of a face-centered cubic system (fcc) sphere array that is well ordered. In one embodiment, the (111) planes of the fcc sphere array are parallel to the angled side walls of the V-shaped groove. The (100) plane of the fcc sphere array is parallel to the top surface of the substrate, and may show a square symmetry among adjacent spheres. This square symmetry is unlike the hexagonal symmetry seen in monolayers of spherical domains and is a useful geometry for lithography applications, especially those used in semiconductor applications. Further, the sphere size in the top layer of the block copolymer adjusts depending on the relationship between the periodicity of the block copolymer and the film thickness within the V-shaped groove.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

The present invention relates to the spherical morphology of block copolymers. The resulting structures are particularly useful in lithographic applications for forming arrays of discrete metal dots or like shapes in various semiconductor processing applications. In one embodiment, the present invention provides a spherical block copolymer confined in a substantially V-shaped groove. The resulting structure demonstrates a face-centered cubic system (fcc) sphere array, which is naturally close-packed and may have a top surface that shows a substantially square symmetry that may be useful in fabricating square arrays of functional nanostructures. Such arrangements do not occur in monolayers of spherical domains, which are generally restricted to hexagonal symmetry, or in bulk spherical block copolymers, which typically pack in a body-centered cubic system (bcc) structure.

In one embodiment, a set of V-shaped grooves is formed by anisotropic etching of a substrate, such as a (100) oriented silicon (Si) wafer or other single crystal substrate. Notably, the orientation of a wafer surface or a crystal plane of a material is identified herein using Miller indices (hkl), as will be understood by those skilled in the art. A V-shaped groove is defined as any type of groove wherein the upper, opposing side walls of the groove are angled and form an angle less than 180 degrees relative to one another. The bottom of the V-shaped groove does not need to come to a defined point. The bottom of the "V" may be flat, curved, or formed from additional walls.

In this embodiment, a tri-layer resist stack containing an antireflective coating, silica, and a photoresist is deposited onto a Si substrate that has been coated with 30 nm of silicon nitride. A grating image is recorded in the photoresist using a Lloyd's Mirror interference lithography system [26] with a 325-nm-wavelength helium-cadmium laser. The period of the grating is varied between 400 and 200 nanometers (nm) by changing the angle of incidence of the expanded laser beam on the substrate and an adjacent mirror. Achromatic interference lithography is employed to pattern 100 nm periodic gratings [27]. The periodic grating structure in the developed photoresist is transferred through the nitride layer by a series of reactive-ion-etching steps.

Figure 1A:
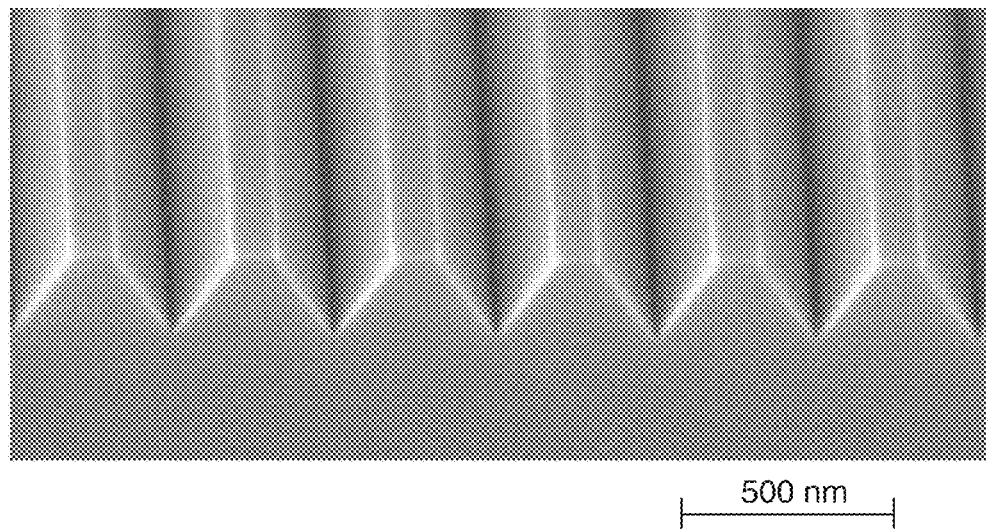
FIG. 1(a) is an image of V-shaped grooves anisotropically etched in a (100) silicon substrate with a 400 nm period, according to one embodiment of the present invention.

After etching, the remaining tri-layer resist stack is removed by a resist stripper, such as EKC265, at 70° C., followed by oxygen plasma. The Si substrate is then dipped into buffered hydrofluoric acid, immediately prior to etching the silicon in 25% Potassium Hydroxide (KOH) at 40° C. with ultrasonic agitation. After the silicon etch, the nitride mask is removed by hydrofluoric acid solution and cleaned by oxygen ashing. In this example, the resulting V-shaped grooves in the Si substrate have widths varying from 50 to 290 nm, as illustrated in the photograph of FIG. 1(a). A native silicon oxide layer having a thickness of approximately two to three (2-3) nm is present on the groove walls.

Figure 1B:
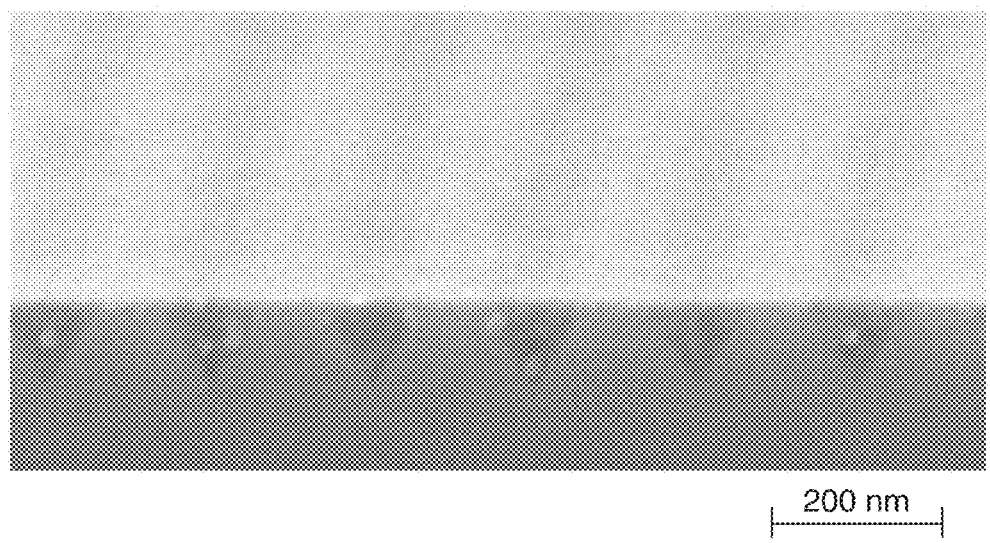
FIG. 1(b) is an image of a block copolymer film spun on V-shaped grooves and then annealed at 140° C. for 72 hours where a block copolymer fills the grooves to leave a planar surface.

Continuing with the example, a spherical-morphology polystyrene (PS)-block-polyferrocenyldimethylsilane (PFS) block copolymer [28], with a molecular weight of 32 kg/mol for PS and 10 kg/mol for PFS, is spin coated from 1.5 weight % toluene solution onto the grooved substrates, where the thickness is controlled by the spin speed. Micro-phase separation is carried out by an annealing process under vacuum at 140° C. for 72 hours. During annealing, the block copolymer flows into the grooves, resulting in a planar film that partially or completely fills the grooves, as illustrated in FIG. 1(b). Preferably, the mesas between the grooves are left free from the block copolymer.

To actually view the arrangement of the PFS spheres on the top surface or the cleaved cross-section, the substrate may be subjected to deep-UV exposure and the PS matrix may be partially etched by an oxygen plasma. Additionally, the domain arrangement at the flat surfaces of the grooves may be exposed by first applying hot melt glue to the top surface of the sample and then etching away the entire Si substrate in 25% KOH solution to leave triangular prisms of block copolymer attached to the glue that could be viewed from the side.

Figure 2A:
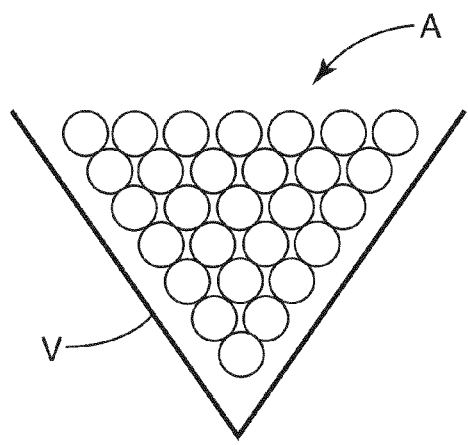
FIG. 2(a) illustrates a cross-section of fcc packed spheres within a V-shaped groove where the (111) close-packed plane of the spheres is parallel to the walls of the V-shaped groove.
Figure 2B:
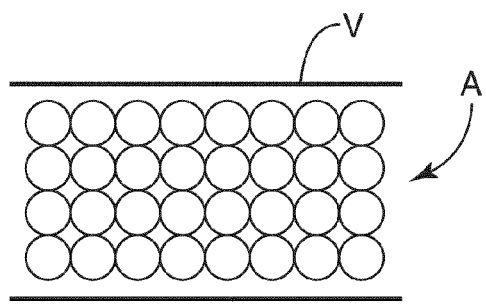
FIG. 2(b) illustrates a top view of the fcc packed spheres of FIG. 2(a).
Figure 2C:
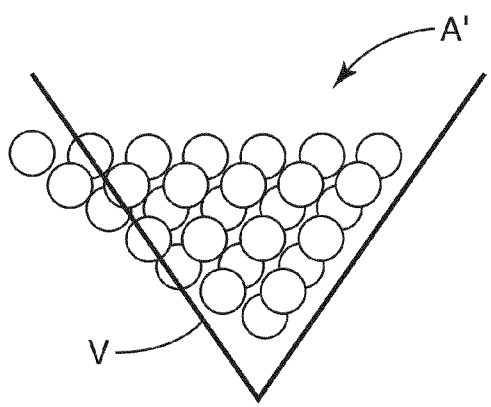
FIG. 2(c) illustrates a cross section of bcc packed spheres within a V-shaped groove where the (110) closest-packed plane of the spheres is parallel to the walls of the V-shaped groove.
Figure 2D:
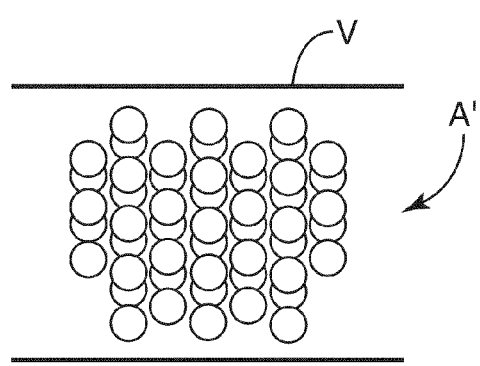
FIG. 2(d) illustrates a top view of the bcc packed spheres of FIG. 2(c).

The present invention provides a unique geometrical packing of the PFS spheres within the V-shaped grooves. In one embodiment, the two side walls of the V-shaped grooves are formed by the (111) planes of the Si substrate and have an intersection angle of about 70.6°. When the intersection is about 70.6°, the symmetry of the top surfaces of the sphere array is substantially square. If this angle is varied, the symmetry becomes rectangular. For example, an intersection at an angle of 90° provides a very rectangular symmetry. An fcc sphere array A can be accommodated within such a V-shaped groove V, as shown in FIGS. 2(a) and 2(b). For a V-shaped groove with an intersection angle of 70.6°, the (111) and (11$\bar{1}$) planes of the sphere array A are parallel to the two side walls for the V-shaped groove V, the (001) plane is parallel to the Si substrate, and the ($\bar{1}$10) plane is perpendicular to the length of the V-shaped groove. FIG. 2(b) shows that the top surface of the fcc sphere array A has a square symmetry, while the cross-section of FIG. 2(a) shows that layers of spheres in the sphere array A are substantially parallel to the surface of the Si substrate and correspond to the parallel (001) planes. In comparison, for bcc packing in the same V-shaped groove V, if the closest-packed plane (110) lies parallel to a groove wall, as illustrated in FIG. 2(c), then the top surface of the sphere array will have a distorted hexagonal arrangement, as shown in FIG. 2(d).

Figure 3A:
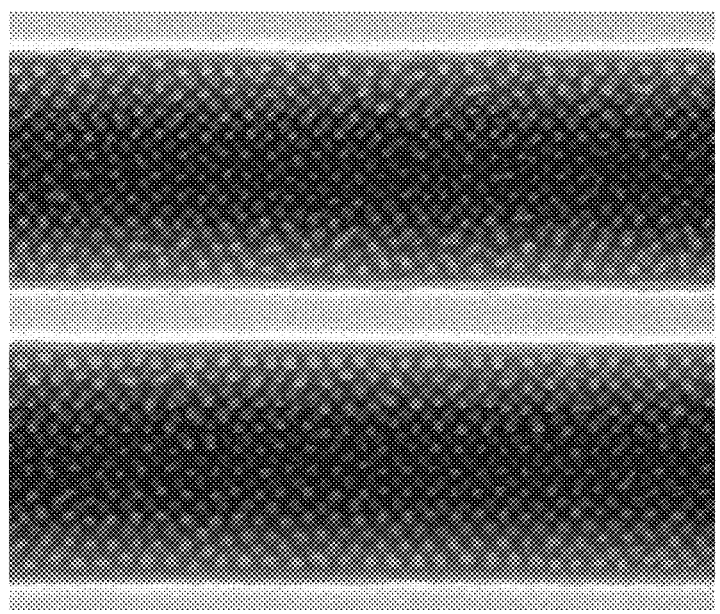
FIG. 3(a) is an image of a top view of films in V-shaped grooves where square packing of the spheres is visible.
Figure 3B:
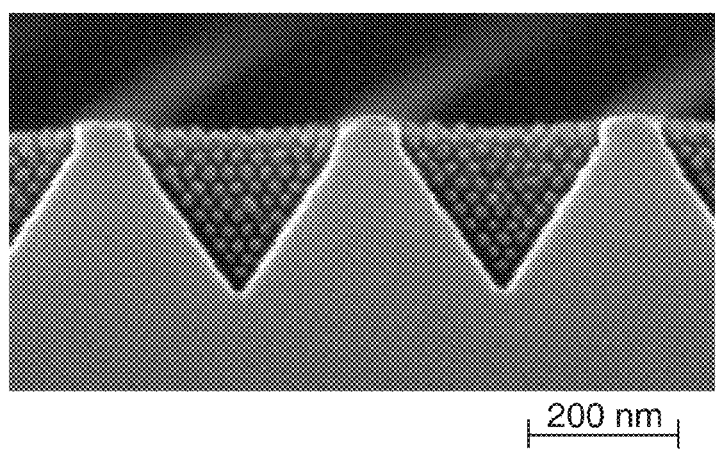
FIG. 3(b) is an image of a cross section of films in V-shaped grooves where a sphere array of 11 rows is visible.
Figure 3C:
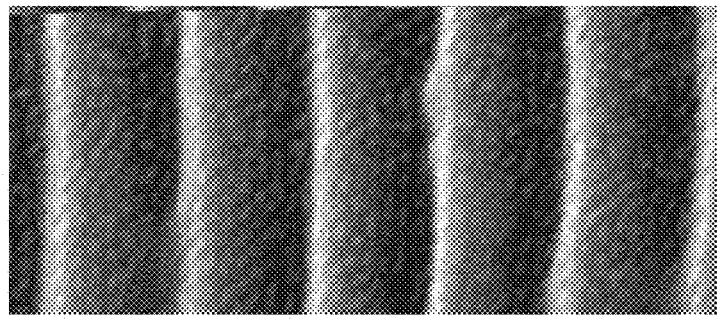
FIG. 3(c) is an image of the block copolymer directly adjacent to the surfaces of the V-shaped grooves where hexagonal arrangement of the spheres is visible.

FIG. 3(a) shows a top view and FIG. 3(b) shows a cross-section of an etched sphere array. The top surface shows a square symmetry in the sphere packing, and the cross-section shows 11 rows of spheres where each row is substantially parallel to the surface of the Si substrate. This arrangement is consistent with the fcc packing shown in FIGS. 2(a) and 2(b). For the block copolymer in this example, the average center-to-center distance in a close-packed monolayer of spheres is p0=28.6 nm, and the spacing between two parallel close-packed rows in a monolayer of spheres is d0=24.8 nm. On the basis of 3D fcc packing, a spacing of $t_o=\sqrt{2}d_0/\sqrt{3}=20.25$ nm is expected between the rows of spheres in the cross-sectional image of the sphere array in the V-shaped groove. This is in agreement with the average interlayer spacing (excluding the top layer) of 20.5 nm measured from the cross-sectional image, FIG. 3(b). This confirms that the PFS spheres are packed in an fcc arrangement. FIG. 3(c) shows a side view of the block copolymer in a V-shaped groove after removal of the substrate and viewed at an angle from the normal to show one surface of the block copolymer prisms. The hexagonal arrangement of domains that can be seen on the surfaces of the block copolymer (i.e., in contact with the original groove surfaces) is consistent with the (111) planes of fcc packing.

Although the block copolymer of the primary example is PS-PFS, other block copolymer combinations are applicable. Exemplary block copolymers include, but are not limited to polystyrene-b-poly(methyl methacrylate) (PS-PMMA), polystyrene-b-poly(dimethyl-siloxane) (PS-PDMS), polystyrene-b-poly(2-vinyl pyridine) (PS-P2VP), polystyrene-b-polybutadiene (PS-PB), and polystyrene-b-polybutadiene-b-poly(methyl methacrylate) (PS-PB-PMMA).

Previous work has shown that spherical-morphology block copolymers form bcc structures in the bulk, with fcc expected only under very limited conditions of composition, segment interaction parameter, and chain length [29]. However, close-packing is typically found in thin films consisting of a monolayer of spheres [30]. In films with two or three layers, close-packing has also been found [31], but in films with a larger number of layers, bcc packing has been observed with the (110) plane parallel to the substrate [32-33]. For example, PS-P2VP films with six layers of spheres showed a bcc structure [32]. In the current example, it is likely that the geometrical constraint of the V-shaped grooves would stabilize the fcc arrangement even to relatively thick films.

Figure 4A:
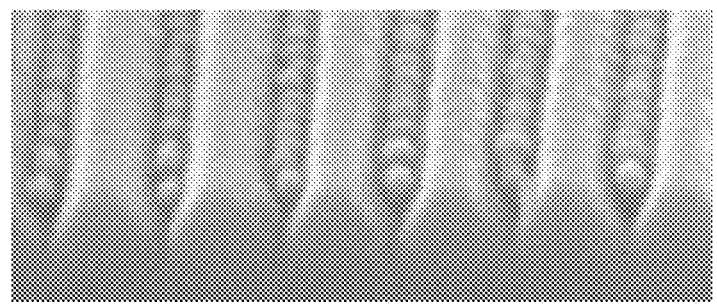
FIG. 4(a) is an image of block copolymer films within V-shaped grooves where the number N of (100) layers of block copolymer spheres in the groove is 1 (N=1) and the black scale bar represents 200 nm.
Figure 4B:
FIG. 4(b) is an image of block copolymer films within V-shaped grooves where the number N of (100) layers of block copolymer spheres in the groove is 2 (N=2) and the black scale bar represents 200 nm.
Figure 4C:
FIG. 4(c) is an image of block copolymer films within V-shaped grooves where the number N of (100) layers of block copolymer spheres in the groove is 3 (N=3) and the black scale bar represents 200 nm.
Figure 4D:
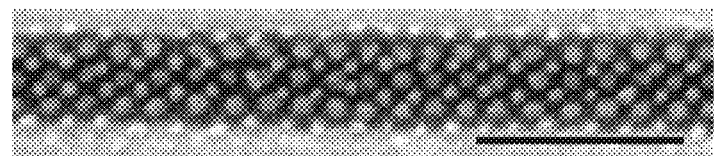
FIG. 4(d) is an image of block copolymer films within V-shaped grooves where the number N of (100) layers of block copolymer spheres in the groove is 4 (N=4) and the black scale bar represents 200 nm.
Figure 4E:
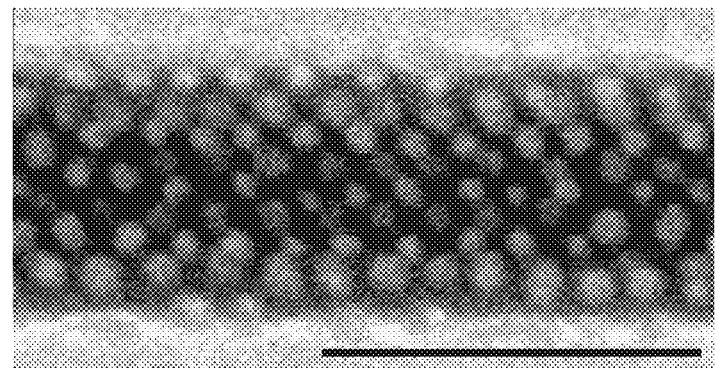
FIG. 4(e) is an image of block copolymer films within V-shaped grooves where the number N of (100) layers of block copolymer spheres in the groove is 5 (N=5) and the black scale bar represents 200 nm.

The effect of block copolymer film thickness on the structure of the PFS sphere array is now described. For the smallest V-shaped grooves with the thinnest films, a single row of spheres may be formed in the V-shaped groove as shown in FIG. 4(a). In this sample, the film thickness, which is measured from the intersection point of the two sides of the V-shaped groove to the top of the sphere in the cross-sectional view, is 36-40 nm. A 73-nm-thick film shows a two-layer arrangement where the second layer of spheres is offset from the spheres in the first row and has a square arrangement, as illustrated in FIG. 4b. FIGS. 4(c), 4(d), and 4(e) show arrangements of 3, 4, and 5 layers, respectively, which are formed in deeper grooves. The top layer of spheres again has a square arrangement, but its sphere diameter is often smaller than that of the lower layers. In addition, the spacing between the top layer of spheres and the layer immediately below may differ from the average spacing between layers. The same behavior may be seen in thicker films, such as that provided in FIG. 3. For example, films that are 216-229 nm thick may consist of 10 layers of spheres, whereas films that are ~230-240 nm thick may have an additional layer of smaller spheres, and films that are ~240-255 nm thick may consist of 11 layers of approximately uniform spheres.

Figure 5A:
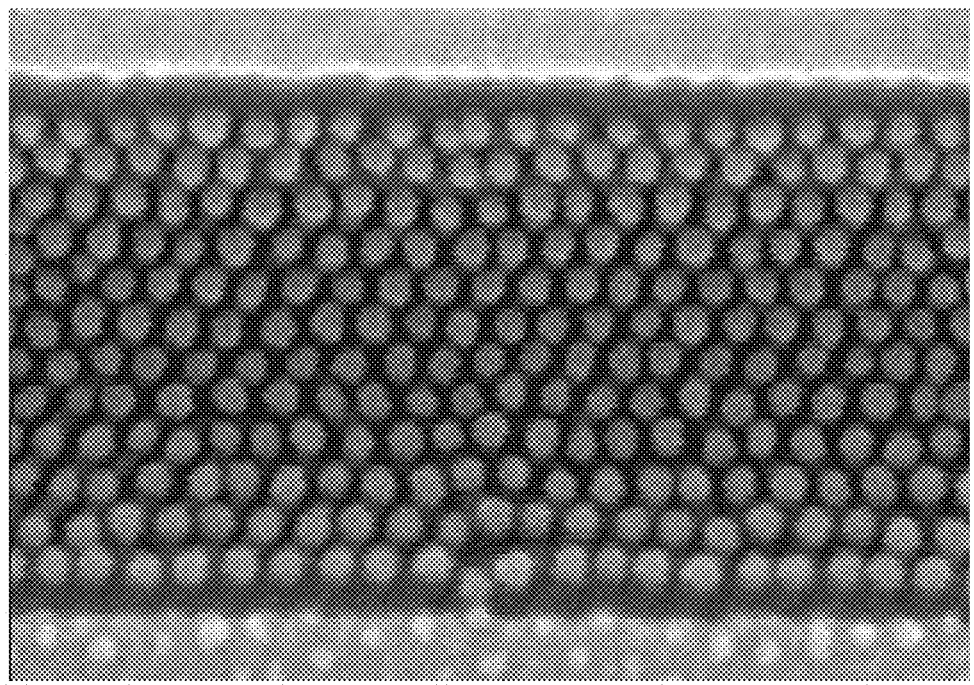
FIG. 5(a) is an image of a sphere array showing a close-packed sphere arrangement on the top surface.
Figure 5B:
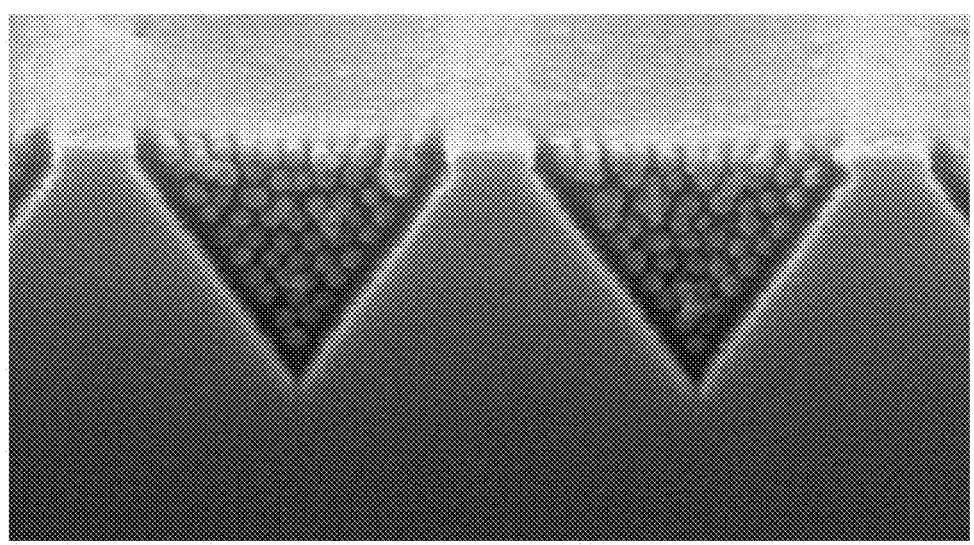
FIG. 5(b) is an image of a cross-section of the sample of FIG. 5(a) showing the non-epitaxial top layer above the fcc arrangement of the lower layers of spheres.

In some cases, the existence of a close-packed sphere arrangement on the top surface of the V-shaped groove is observed, as shown in FIGS. 5(a) and 5(b). In this example, the cross-sectional image of FIG. 5(b) indicates that the lower layers are in an fcc arrangement, but the top view of FIG. 5(a) indicates that the top layer of spheres is no longer epitaxial with the underlying structure and contains 12 rows of spheres. The top layer packing is identical to that seen in a close-packed monolayer of spheres templated by a shallow, vertical-walled trench [29-34].

The size and number of spheres in the top layer of the fcc array may be controlled. To quantify the sphere arrangement on top of and within the fcc array, a plot of the number of layers of spheres seen in the cross-sectional images versus the block copolymer film thickness is provided in FIG. 6. This thickness is divided by to=20.46 nm, which is the average spacing between layers in the cross-sectional projection measured from all samples while excluding the spacing between the top and second layers in those samples with a smaller sphere diameter in the top layer. Two sets of data points are plotted. Solid points represent samples in which the diameter of the top-layer spheres is similar to that of underlying layers. In these samples, the top layer was usually hexagonally arranged, and therefore nonepitaxial with the underlying fcc array, as in FIG. 5(a), although some samples showed a square symmetric, epitaxial top layer, as in FIG. 4(b) or 4(e). These data points form a "staircase" plot in which a given integer number of layers, N, can be found in films within a thickness range of approximately (N+0.5)to to (N+1.5)to. The second set of data points, shown with open symbols, represents arrays where the spheres of the top layer are significantly smaller than the underlying spheres. In this case, a fractional layer number was calculated as the ratio of the projected area of the top layer of spheres to that of the underlying spheres in the cross-sectional image. All of these samples show square-symmetric, epitaxial top layers. The data points are clustered between the horizontal sections of the staircase plot.

Figure 6:
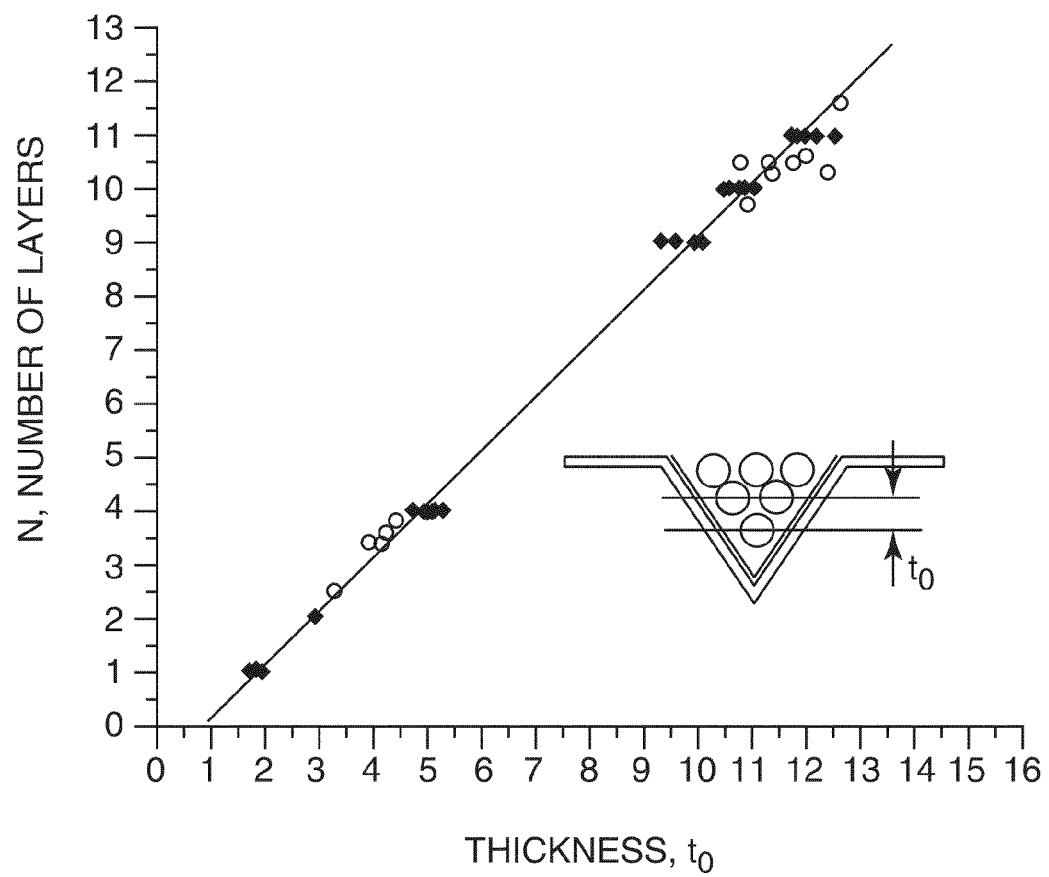
FIG. 6 is a graph of the number of layers of spheres plotted against a thickness of the block copolymer film according to one embodiment.

A solid line, corresponding to a slope of 1.0, is fitted through the solid data points. This intersects the x axis at a thickness of 0.99 to. The nonzero intercept is due to the presence of the brush layer at the surfaces of the grooves. The PFS block preferentially wets the surfaces of the groove [34], which are covered by a thin native oxide layer, leading to an offset of the first layer of spheres above the lowest part of the V-shaped groove, as indicated in the inset of FIG. 6. Films thinner than ~to are expected to contain only of a brush layer and would not show a well-developed sphere morphology.

These results show that the block copolymer can fill the V-shaped confinement in different ways depending on the relationship between the block copolymer film thickness and the periodicity of the spherical domains. The geometry of the V-shaped groove promotes an fcc packing of the spheres, which conforms exactly to the angle of the groove. If the film thickness is close to an integer number of (100) fcc sphere layers, then a well-ordered fcc structure is expected to form. However, deviations from exact commensurability can be accommodated in two ways: either by the formation of a top fcc layer with a different sphere diameter and thickness, or by a change in the packing of the top layer that maintains, approximately, the sphere diameter, but leads to defective packing such that the top layer is no longer epitaxial with the underlying fcc sphere array. For instance, the example of FIGS. 5(a) and 5(b) exhibits the latter case, where the loss of epitaxy in the top layer has allowed an additional row of spheres to be present in the top layer. The coexistence of these two types of morphology in this block copolymer system suggests that the energy differences between them are modest, though the formation of the smaller-diameter epitaxial spheres appears to dominate when the film thickness is furthest from commensurability.

Figure 7:
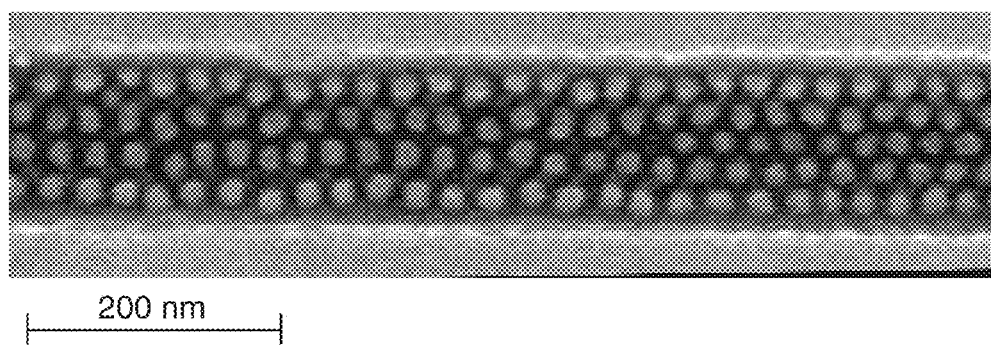
FIG. 7 is an image showing a change in the number of rows in the top layer of a sphere array from 4 to 5.

Finally, FIG. 7 shows the coexistence of different top-layer sphere arrangements within a groove. This sample shows a change from four rows of spheres to five, with the introduction of a defect in the top, nonepitaxial layer of spheres. The behavior of this spherical-morphology PS-PFS block copolymer shows interesting parallels with the packing of the same block copolymer in shallow, vertical-walled trenches [34]. For the same PS-PFS block copolymer arranged in a shallow trench, a well-ordered close-packed monolayer of spheres is observed for all groove widths up to approximately 13do (~320 nm), beyond which long-range order breaks down. In the ordered monolayer, the row spacing adjusts such that an integer number of rows of block copolymer spheres forms within the groove, leading to a staircase-shaped plot of number of rows of spheres versus groove width, but for all groove widths the sphere array is close-packed with hexagonal (or slightly distorted hexagonal) packing. In contrast, the block copolymer confined within the V-shaped groove does not adjust its interlayer spacing $t0$ within the bulk of the V-shaped groove, and incommensurabilities are instead accommodated by changes in packing, or changes in sphere diameter, which are restricted to the top layer of spheres. Thus, the top layer of spheres may show a hexagonal arrangement or a square arrangement. It is significant that the groove geometry promotes an fcc sphere array even for relatively thick films, despite the bulk morphology being bcc.

As a further comparison, colloidal spheres, such as silica or latex, assembled in V-shaped grooves also show fcc packing with a square-symmetric top layer [35-38], which is superficially similar to that of the block copolymer spheres, though on a much larger length scale. However, if the number of spheres available does not form an integer number of layers, then partial layers are created, containing vacancies. In the block copolymer case, the local density of the block copolymer remains constant and the system cannot form "vacancies," so the incommensurability must be accommodated by adjustment of the sphere size or the packing structure.

The square array formed by the fcc-packed block copolymer may have uses in block copolymer lithography or other device applications where a square array of nanostructures is required. A pattern transfer method, such as nano-imprinting, may be used. For example, an imprint stamp from an etched PS-PFS block copolymer film may be made by coating the film with a conformally sputtered 7-nm-thick silica layer and then stamping it into a polymethyl methacrylate (495 kg/mol) resist layer with a pressure of 150 MPa at 110° C. for 3.5 hours. This leads to an imprinted pattern in the resist corresponding to the topography of the top layer of PFS domains.

In conclusion, a spherical block copolymer is formed within V-shaped grooves of a substrate to form an fcc sphere array because of the geometric constraints of the V-shaped grooves. Within the fcc sphere array, the close-packed (111) planes are parallel to the walls of the V-shaped grooves, and the top surfaces of the fcc sphere array are on the (100) plane and have square symmetry. The top layer of spheres adjusts its structure depending on the commensurability between the thickness of the block copolymer and the (100) plane spacing. Either the sphere diameter adjusts within the top layer while maintaining the fcc epitaxy, or the top layer of spheres may lose its epitaxial relation with the underlying fcc lattice and instead form a close-packed layer. This behavior differs from that of colloidal sphere packing, which exhibits vacancies in the structure if the top layer of spheres is incomplete. The square symmetry of the top layer of the fcc block copolymer sphere array may provide a useful template for making square arrays of nanostructures. The ability to form ordered 3D arrangements for a range of film thicknesses makes block copolymers attractive for the fault-tolerant templated self-assembly of nanoscale periodic arrays.

Those skilled in the art will recognize improvements and modifications to the preferred embodiments of the present invention. All such improvements and modifications are considered within the scope of the concepts disclosed herein and the claims that follow.

REFERENCES

Documents cited above, which are incorporated herein by reference in their entireties:

[1] Li, R. R.; Dapkus, P. D.; Thompson, M. E.; Jeong, W. G.; Harrison, C.; Chaikin, P. M.; Register, R. A.; Adamson, D. H. *Appl. Phys. Left.* 2000, 76, 1689.
[2] Park, M.; Harrison, C.; Chaikin, P. M.; Register, R. A.; Adamson, D. H. *Science* 1997, 276, 1401.
[3] Lopes, W. A.; Jaeger, H. M. *Nature* 2001, 414, 735.
[4] Thurn-Albrecht, T.; Schotter, J.; Kästle, G. A.; Emley, N.; Shibauchi, T.; Krusin-Elbaum, L.; Guarini, K.; Black, C. T.; Tuominen, M. T.; Russell, T. P. *Science* 2000, 290, 2126.
[5] Cheng, J. Y.; Ross, C. A.; Chan, V. Z. H.; Thomas, E. L.; Lammertink, R. G. H.; Vancso, G. *J. Adv. Mater.* 2001, 13, 1174.
[6] Black, C. T.; Guarini, K. W.; Milkove, K. R.; Baker, S. M.; Russell, T. P.; Tuominen, M. T. *Appl. Phys. Left.* 2001, 79, 409.
[7] Naito, K.; Hieda, H.; Sakurai, M.; Kamata, Y.; Asakawa, K. *IEEE Trans. Magn.* 2002, 38, 1949.
[8] Guarini, K. W.; Black, C. T.; Xhang, Y.; Babich, I. V.; Sikorski, E. M.; Gignac, L. M. *IEEE Electron. Device Left.* 2003, 541.
[9] Black, C. T. *Appl. Phys. Lett.* 2005, 87, 163116.
[10] Morkved, T. L.; Lu, M.; Urbas, A. M.; Ehrichs, E. E.; Jaeger, H. M.; Mansky, P.; Russell, T. P. *Science* 1996, 273, 931.
[11] Böker, A.; Elbs, H.; Hänsel, H.; Knoll, A.; Ludwigs, S.; Zettl, H.; Urban, V.; Abetz, V.; Müller, A. H. E.; Krausch, G. *Phys. Rev. Lett.* 2002, 89, 135502.
[12] van der Meer, P. R.; Meijer, G. C. M.; Vellekoop, M. J.; Kerkvliet, H. M. M.; van den Boom, T. J. J. *Sens. Actuators, A* 1998, A71, 27.
[13] Angelescu, D. E.; Waller, J. H.; Register, R. A.; Chaikin, P. M. *Adv. Mater,* 2005, 17, 1878.
[14] Cheng, J. Y.; Ross, C. A.; Thomas, E. L.; Smith, H. I.; Vansco, G. *J. Appl. Phys. Lett.* 2002, 81, 3657.
[15] Segalman, R. A.; Yokoyama, H.; Kramer, E. J. *Adv. Mater.* 2001, 13, 1152.
[16] Edwards, E. W.; Stoykovich, M. P.; Muller, M. M.; Solak, H. H.; DePablo, J. J.; Nealey, P. F. *J. Polym. Sci. Part B: Polym. Phys.* 2005, 43. 3444.
[17] Sundrani, D.; Darling, S. B.; Sibener, S. J. *Langmuir* 2004, 20, 5091.

[18] Black, C. T.; Bezencenet, O. *IEEE Trans. Nanotechnol.* 2004, 3, 412.
[19] Xiao, S.; Yang, X. M.; Edwards, E. W.; La, Y. H.; Nealey, P. F. *Nanotechnology* 2005, 16, s324.
[20] Stoykovich, M. P.; Müller, M.; Kim, S. O.; Solak, H. H.; Edwards, E. W.; de Pablo, J. J.; Nealey, P. F. *Science* 2005, 308, 1442.
[21] Fasolka, M. J.; Harris, D. J.; Mayes, A. M.; Yoon, M.; Mochrie, S. G. J. *Phys. Rev. Lett.* 1997, 79, 3018.
[22] Wu, Y.; Cheng, G. S.; Katsov, K.; Sides, S. W.; Wang, J. F.; Tang, J.; Fredrickson, G. H.; Moskovits, M.; Stucky, G. D. *Nano Lett.* 2004, 4, 2337.
[23] Yu, B.; Sun, P. C.; Chen, T. C.; Jin, Q. H.; Ding, D. T.; Li, B. H.; Shi, A. C. *Phys. Rev. Lett.* 2006, 96, 138306.
[24] Shin, K.; Xiang, H.; Moon, S. I.; Kim, T.; McCarthy, T. J.; Russell, T. P. *Science* 2004, 306, 76.
[25] Bellare, J. R.; Thomas, E. L. *Proc. Electron Microscopy Soc. Am.* 1989, 354.
[26] Ross, C. A.; Haratani, S.; Castaño, F. J.; Hao, Y.; Hwang, M.; Shima, M.; Cheng, J. Y.; Vögeli, B.; Farhoud, M.; Walsh, M.; Smith, H. I. J. *Appl. Phys.* 2002, 91, 6848.
[27] Savas, T. A.; Farhoud, M.; Hwang, M.; Smith, H. I.; Ross, C. A. J. *Appl. Phys.* 1999, 85, 6160.
[28] Ni, Y.; Rulkens, R.; Manners, I. *J. Am. Chem. Soc.* 1996, 118, 4102.
[29] Matsen, M. W.; Bates, F. S. *Macromolecules* 1996, 29, 1091.
[30] Thomas, E. L.; Kinning, D. J.; Alward, D. B.; Henkee, C. S. *Macromolecules* 1987, 20, 2934.
[31] Henkee, C. S.; Thomas, E. L.; Fetters, L. J. *J. Mater. Sci.* 1988, 23, 1685.
[32] Yokoyama, H.; Kramer, E. J.; Rafailovich, M. H.; Sokolov, J.; Schwarz, S. A. *Macromolecules* 1998, 31, 8826.
[33] Yokoyama, H.; Mates, T.; Kramer, E. J. *Macromolecules* 2000, 33, 1888.
[34] Cheng, J. Y.; Mayes, A. M.; Ross, C. A. *Nat. Mater.* 2004, 3, 823.
[35] Matsuo, S.; Fujine, T.; Fukuda, K.; Juodkazis, S.; Misawa, H. *Appl. Phys. Lett.* 2003, 82, 4283.
[36] Yin, Y.; Lu, Y.; Gates, B.; Xia, Y. *J. Am. Chem. Soc.* 2001, 123, 8718.
[37] Yin, Y.; Xia, Y. *Adv. Mater.* 2002, 14, 8, 605.
[38] Ozin, G.; Yang, S. M. *Adv. Funct. Mater.* 2001, 11. 95.

What is claimed is:

1. A block copolymer-based thin film formed from a process comprising:
   providing a substrate having at least one V-shaped groove formed at least in part by two angled side walls; and
   applying a self-assembling block copolymer in the at least one V-shaped groove, an angle of the walls for the at least one V-shaped groove and the block copolymer selected such that the block copolymer forms a face-centered cubic system (fcc) sphere array of close-packed spheres within the at least one V-shaped groove.

2. The block copolymer-based thin film formed by the process of claim 1 wherein the at least one V-shaped groove is formed by (111) oriented planes of the substrate wherein (111) is a Miller index.

3. The block copolymer-based thin film formed by the process of claim 1 wherein respective (111) oriented planes of the fcc sphere array of close-packed spheres are parallel to the two angled side walls of the at least one V-shaped groove, and wherein (111) is a Miller index.

4. The block copolymer-based thin film formed by the process of claim 1 wherein a top layer of spheres in the fcc sphere array of close-packed spheres provides a substantially square symmetry among adjacent spheres of the sphere array.

5. The block copolymer-based thin film formed by the process of claim 2 wherein an angle formed by the two angled side walls is about 70.6 degrees.

6. The block copolymer-based thin film formed by the process of claim 1 wherein providing the substrate further comprises etching the at least one V-shaped groove in the substrate.

7. The block copolymer-based thin film formed by the process of claim 1 wherein the at least one V-shaped groove is etched in a (100) oriented substrate wherein (100) is a Miller index.

8. The block copolymer-based thin film formed by the process of claim 1 wherein the substrate is a silicon wafer.

9. The block copolymer-based thin film formed by the process of claim 1 wherein the substrate comprises a plurality of V-shaped grooves including the at least one V-shaped groove, and mesas are provided on a top surface of the substrate between adjacent ones of the plurality of V-shaped grooves.

10. The block copolymer-based thin film formed by the process of claim 1 wherein the fcc sphere array of close-packed spheres maintains order throughout the at least one V-shaped groove.

11. The block copolymer-based thin film formed by the process of claim 1 wherein respective (111) and (11$\bar{1}$) oriented planes of the fcc sphere array of close-packed spheres are parallel to the two angled side walls of the at least one V-shaped groove, and wherein (111) and (11$\bar{1}$) are Miller indexes.

12. The block copolymer-based thin film formed by the process of claim 1 wherein a (001) oriented plane of the fcc sphere array of close-packed spheres is parallel to a top surface of the substrate, and wherein (001) is a Miller index.

13. The block copolymer-based thin film formed by the process of claim 1 wherein a ($\bar{1}$10) oriented plane of the fcc sphere array of close-packed spheres is perpendicular to a length of the at least one V-shaped groove, and wherein ($\bar{1}$10) is a Miller index.

14. The block copolymer-based thin film formed by the process of claim 1 wherein a diameter of spheres in a top layer of spheres in the fcc sphere array is smaller than a diameter of spheres in underlying layers of spheres in the fcc sphere array.

15. The block copolymer-based thin film formed by the process of claim 1 wherein a top layer of spheres in the fcc sphere array loses an epitaxial relationship with underlying layers of spheres in the fcc sphere array.

16. The block copolymer-based thin film formed by the process of claim 1 wherein the fcc sphere array comprises a plurality of layers of spheres.

17. The block copolymer-based thin film formed by the process of claim 16 wherein the fcc sphere array comprises more than three layers of spheres.

18. The block copolymer-based thin film formed by the process of claim 1 wherein for the at least one V-shaped groove, the two angled side walls come to a point at a bottom of the at least one V-shaped groove.

19. The block copolymer-based thin film formed by the process of claim 1 wherein the self-assembling block copolymer is a diblock copolymer.

20. The block copolymer-based thin film formed by the process of claim 1 wherein one block of the block copolymer comprises at least one of polystyrene, polyferrocenyldimethylsilane, poly(methyl methacrylate), poly(dimethyl-siloxane), poly(2-vinyl pyridine), and polybutadiene.

21. The block copolymer-based thin film formed by the process of claim 1 wherein the block copolymer has a spherical morphology.

\* \* \* \* \*